(12) United States Patent
Gonion

(10) Patent No.: US 7,800,519 B2
(45) Date of Patent: Sep. 21, 2010

(54) METHOD AND APPARATUS FOR COMPRESSING AND DECOMPRESSING DATA

(75) Inventor: Jeffry E. Gonion, Campbell, CA (US)

(73) Assignee: Apple Inc., Cupertino, CA (US)

( * ) Notice: Subject to any disclaimer, the term of this patent is extended or adjusted under 35 U.S.C. 154(b) by 44 days.

(21) Appl. No.: 12/241,785

(22) Filed: Sep. 30, 2008

(65) Prior Publication Data

US 2010/0079314 A1   Apr. 1, 2010

(51) Int. Cl.
*H03M 7/00* (2006.01)
(52) U.S. Cl. .......................................... 341/60; 341/67
(58) Field of Classification Search .................. 341/50, 341/65, 67, 60, 55, 51; 370/389, 413
See application file for complete search history.

(56) References Cited

U.S. PATENT DOCUMENTS

| | | | |
|---|---|---|---|
| 5,982,306 A * | 11/1999 | Nam ............................ | 341/67 |
| 6,621,428 B1 | 9/2003 | Crane | |
| 6,661,845 B1 | 12/2003 | Herath | |
| 6,862,278 B1 * | 3/2005 | Chang et al. ................ | 370/389 |
| 6,947,413 B2 * | 9/2005 | Wakabayashi et al. ...... | 370/358 |
| 7,016,366 B2 * | 3/2006 | Kawarai et al. ............. | 370/413 |
| 7,148,822 B2 * | 12/2006 | Suzuki ........................ | 341/67 |
| 7,180,901 B2 | 2/2007 | Chang | |
| 7,289,510 B2 * | 10/2007 | Matsumura .............. | 370/395.1 |
| 7,356,083 B2 * | 4/2008 | Herath .................. | 375/240.23 |

* cited by examiner

*Primary Examiner*—Peguy JeanPierre
(74) *Attorney, Agent, or Firm*—Park, Vaughan & Fleming LLP

(57) ABSTRACT

One embodiment of the present invention provides an apparatus for compressing data, comprising a compression mechanism which includes N channels. During operation, the compression mechanism receives a set of data words from an input bit-stream, compresses the data words into a set of variable-length words, and stores an I-th variable-length word in the set of variable-length words into a fixed-packet for an I-th channel. Then, the compression mechanism assembles each fixed-length packet into an output stream when the packet becomes full. Some other embodiments of the present invention provide an apparatus for data decompression, comprising a parallel-processing mechanism which includes N decompression mechanisms. During operation, each decompression mechanism retrieves a fixed-length packet from a corresponding channel in an input stream, retrieves and decompresses a set of variable-length words from the fixed-length packet, and assembles the decompressed variable-length words into every N-th position of an output stream beginning at an offset I corresponding to the channel.

28 Claims, 12 Drawing Sheets

METHOD AND APPARATUS FOR COMPRESSING AND DECOMPRESSING DATA

BACKGROUND

1. Field of the Invention

Embodiments of the present invention relate to data processing systems. More specifically, embodiments of the present invention relate to techniques for compressing and decompressing data.

2. Related Art

Many modern electronic devices can operate on large amounts of data (i.e., data files or data streams from a network). For example, these electronic devices can operate on multimedia files such as digital video files, document files such as scanned text documents, simulation files, and other types of files. Because large files can consume significant amounts of memory, and transferring large files across a network can consume considerable amounts of network bandwidth, compression techniques have been developed to reduce the size of the data files. Some compression techniques involve compressing the data using "lossless" compression techniques. Lossless compression techniques remove redundant information from the data in a manner that does not compromise the integrity of the data, thereby allowing for bit-accurate reconstruction of the original data from the compressed data.

Some lossless compression systems replace fixed-length words with shorter variable-length codes when compressing data files. In such systems, shorter codes can be assigned to words that are used more frequently and longer codes can be assigned to words that appear less frequently. For example, some lossless compression systems use Huffman coding, context-adaptive variable length coding (CALVC), or context-adaptive binary arithmetic coding (CABAC) to compress data files. Lossless compression typically produces a dense bit-stream of variable-length compressed data words. Because maximal compression is the primary goal, designers have given little consideration to the processing required to decompress the data. Thus, existing systems are forced to decompress data serially, which is time-consuming.

Hence, what is needed is a method for compressing and decompressing data without the above-described problem.

SUMMARY

Some embodiments of the present invention provide a system for compressing data (e.g., computer system 100 in FIG. 1). In these embodiments, the system includes a compression mechanism which includes N channels. In some embodiments of the present invention, the compression mechanism is processor 102 or an application-specific integrated circuit (ASIC). During operation, the compression mechanism: (1) receives a set of data words from an input bit-stream; (2) compresses the data words into a set of variable-length words; (3) stores an I-th variable-length word in the set of variable-length words into a fixed-length packet for an I-th channel; and (4) assembles each fixed-length packet into an output stream when the packet becomes full.

In some embodiments, the compression mechanism compresses the data words using entropy coding.

In some embodiments, the compression mechanism compresses the data words using arithmetic coding.

In some embodiments, the compression mechanism assembles each fixed-length packet into the output stream by appending the fixed-length packet to previously assembled packets.

In some embodiments, the compression mechanism is configured to place a first packet from each of the N channels at predetermined locations in the output stream.

In some embodiments, the fixed-length packet is maintained in a first-in-first-out (FIFO) buffer, ring buffer, dynamically allocated array, statically allocated array, or linked-list.

Some embodiments of the present invention provide a system for decompressing data (e.g., computer system 100 in FIG. 1). In these embodiments, the system includes a parallel-processing mechanism which includes N decompression mechanisms. In some embodiments of the present invention, the parallel-processing mechanism is processor 102 or an application-specific integrated circuit (ASIC). During operation, each decompression mechanism in the parallel-processing mechanism: (1) retrieves a fixed-length packet from a corresponding channel in an input stream; (2) retrieves and decompresses a set of variable-length words from the fixed-length packet; and (3) assembles the decompressed variable-length words into every N-th position of an output stream beginning at an offset I corresponding to the channel.

In some embodiments, the output bit-stream from the parallel-processing mechanism contains commands that are executed during playback to reconstruct a video image.

In some embodiments, at least one decompression mechanism decompresses variable-length words using entropy coding.

In some embodiments, at least one decompression mechanism decompresses variable-length words using arithmetic coding.

In some embodiments, the input bit-stream to the compression mechanism is a bit-stream generated by compressing raw video data from a video source, e.g., a video camera, or a live video feed. In some other embodiments, the input bit-stream is a sequence of commands that can be used to reconstruct ("play back") a video image.

DETAILED DESCRIPTION

Figure 1:
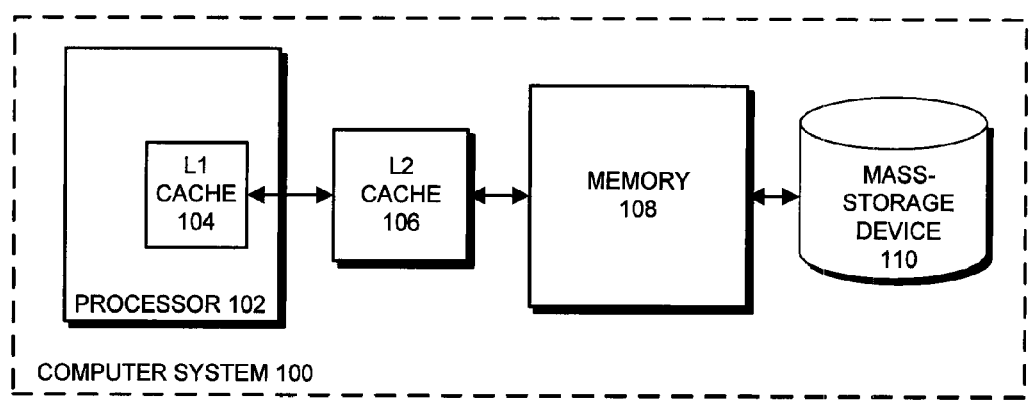
FIG. 1 presents a block diagram of a computer system in accordance with embodiments of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. For example, in some embodiments of the present invention, a computer system such as computer system 100 (see FIG. 1) performs the methods and processes. In alternative embodiments, a different computer system performs the methods and processes.

Furthermore, the methods and processes described below can be embodied in hardware modules. For example, the hardware modules can include, but are not limited to, application-specific integrated circuit (ASIC) chips, field-programmable gate arrays (FPGAs), and other programmable-logic devices now known or later developed. For example, in some embodiments of the present invention, the hardware modules include a microprocessor, such as processor 102 (see FIG. 1). When the hardware modules are activated, the hardware modules perform the methods and processes embodied within the hardware modules.

Data Compression

Embodiments of the present invention facilitate efficient data compression and/or decompression. Generally, compressing data involves reducing the size of files that contain the data, thereby enabling the files to be stored in less memory, processed more efficiently, and consume less bandwidth while being transferred in a network. Conversely, decompressing data involves restoring the data from a compressed data file.

One approach to compressing data involves first applying a lossy compression technique to "raw" (uncompressed) data. The output of the lossy compression technique (i.e., "lossy stream") is subsequently compressed using a lossless compression technique. In some cases, the lossy stream includes a finite set of values, many of which are repeated throughout the stream. For example, data in the lossy stream may be stored in 16-bit words, wherein some 16-bit words are repeated more frequently than others. Lossless compression techniques typically work by mapping variable-length encodings to corresponding fixed-length words. Fixed-length words that appear frequently in the lossy stream are assigned shorter length encodings, whereas fixed-length words that appear less frequently are assigned longer encodings. For example, a frequently used 16-bit fixed-length word may be reduced to 2- or 3-bit variable-length word. The variable-length words are then stored sequentially, typically without padding, which facilitates storing more variable-length words in the same space that was previously used to store the corresponding fixed-length words.

Compressing data using lossless compression typically involves first performing a statistical analysis of the data to determine how frequently each fixed-length word appears in the stream. The metrics collected from the statistical analysis are then used to create a dictionary of mappings that assign variable-length encodings to fixed-length words. The different types of statistical analysis are known in the art and hence are not described in further detail. In the following description of embodiments of the present invention, we assumed that statistical analysis has already taken place and that mappings of variable-length mappings to fixed-length words have already been established.

Several lossless compression techniques are known in the art and are therefore not discussed in further detail. In general, embodiments of the present invention may use any lossless compression technique that assigns variable-length encodings to compress data. For example, some embodiments of the present invention compress data using entropy coding, such as Huffman coding, context-adaptive variable-length coding (CAVLC), and context-adaptive binary arithmetic coding (CABAC). And some other embodiments of the present invention compress data using arithmetic coding.

Video Data Compression and/or Decompression

Some embodiments of the present invention compress and decompress video data. In some embodiments the video data is first compressed using a lossy compression technique. The result of the lossy compression may be a stream of commands (i.e., operands) that are executed during playback to reconstruct a video image. For example, some lossy compression techniques generate commands that contain transformations or relational operations which describe scene changes between video frames. Such lossy compression techniques achieve file-size reductions by only maintaining information about scene changes between frames, rather than maintaining full frame data. (Note that these techniques are referred to as "lossy" because the reconstructed video includes less video information than the original raw video data.)

The output of the lossy compression technique typically includes a fixed set of commands, many of which are repeated throughout the stream. Commands are typically fixed bit length, e.g., 16-bit or 32-bit words. To further reduce the size of the video data, some embodiments of the present invention apply lossless compression techniques to the stream of commands in the lossy stream.

Computer System

FIG. 1 presents a block diagram of a computer system 100 in accordance with embodiments of the present invention. Computer system 100 includes processor 102, L2 cache 106, memory 108, and mass-storage device 110, wherein processor 102 includes L1 cache 104.

Processor 102 can be a general-purpose processor that performs computational operations. For example, processor 102 can be a central processing unit (CPU) such as a microprocessor, a controller, an application-specific integrated circuit (ASIC), or a field-programmable gate array (FPGA).

Mass-storage device 110, memory 108, L2 cache 106, and L1 cache 104 are computer-readable storage devices that collectively form a memory hierarchy that stores data and instructions for processor 102. Generally, mass-storage device 110 is a high-capacity, non-volatile memory, such as a disk drive or a large flash memory, with a large access time, while L1 cache 104, L2 cache 106, and memory 108 are smaller, faster semiconductor memories that store copies of frequently used data. Memory 108 is typically a dynamic random access memory (DRAM) structure that is larger than L1 cache 104 and L2 cache 106, whereas L1 cache 104 and L2 cache 106 are typically comprised of smaller static random access memories (SRAM). In some embodiments of the present invention, L2 cache 106, memory 108, and mass-storage device 110 are shared between one or more processors in computer system 100. Such memory structures are well-known in the art and are therefore not described in more detail.

Computer system 100 can be incorporated into many different types of electronic devices. For example, computer system 100 can be part of a desktop computer, a laptop computer, a server, a media player, an appliance, a cellular phone, a piece of testing equipment, a network appliance, a personal digital assistant (PDA), a hybrid device (i.e., a "smart phone") or another electronic device.

Although we use specific components to describe computer system 100, in alternative embodiments different components may be present in computer system 100. For example, computer system 100 may not include some of the memory hierarchy (e.g., memory 108 and/or mass-storage device 110). Alternatively, computer system 100 may include video cards, video-capture devices, user-interface devices, network cards, optical drives, and/or other peripheral devices that are coupled to processor 102 using a bus, a network, or another suitable communication channel. Computer system 100 may also include one or more additional processors, wherein the processors share some or all of L2 cache 106, memory 108, and mass-storage device 110.

Devices for Compression and Decompression

Figure 2A:
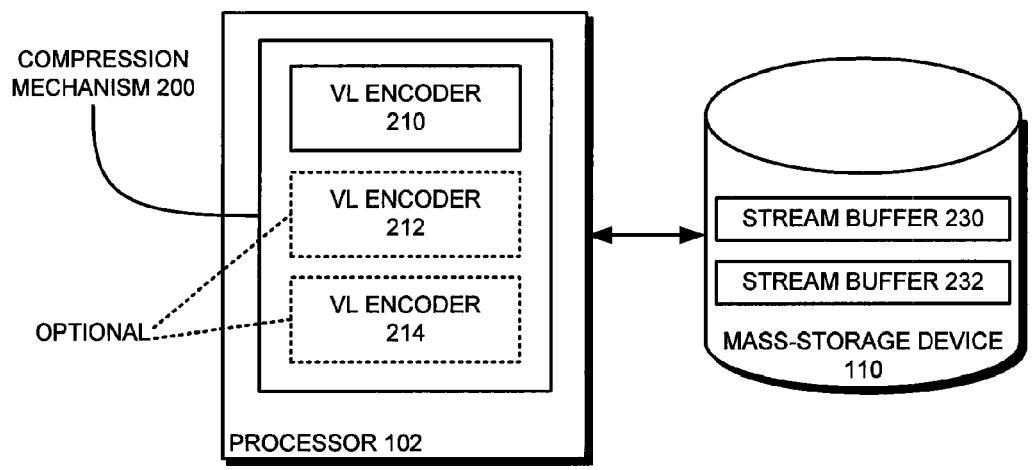
FIG. 2A presents a block diagram illustrating a processor configured to compress data in accordance with embodiments of the present invention.

FIG. 2A presents a block diagram illustrating a processor 102 configured to compress data in accordance with embodiments of the present invention. Processor 102 includes a compression mechanism 200, which includes variable-length encoder (VL encoder) 210 and may include any number of additional VL encoders, such as optional VL encoders 212-214. Mass-storage device 110 includes stream buffers 230-232 where an input and an output stream are respectively stored.

During operation, compression mechanism 200 retrieves a set of data words from the input bit-stream. Then, compression mechanism 200 compresses the data words into a set of variable-length words and stores an I-th variable-length word into a fixed-length packet for an I-th channel. Next, compression mechanism 200 assembles each fixed-length packet into an output stream when the fixed-length packet becomes full.

Compression mechanism 200 uses N "channels," to facilitate organizing packets so they can be decoded in the correct order. A packet for an I-th channel contains variable-length words that are compressed from data words in every I-th location of the input bit-stream. A packet that is placed in a particular channel during compression is decompressed in a decompression unit associated with the channel.

Figure 2B:
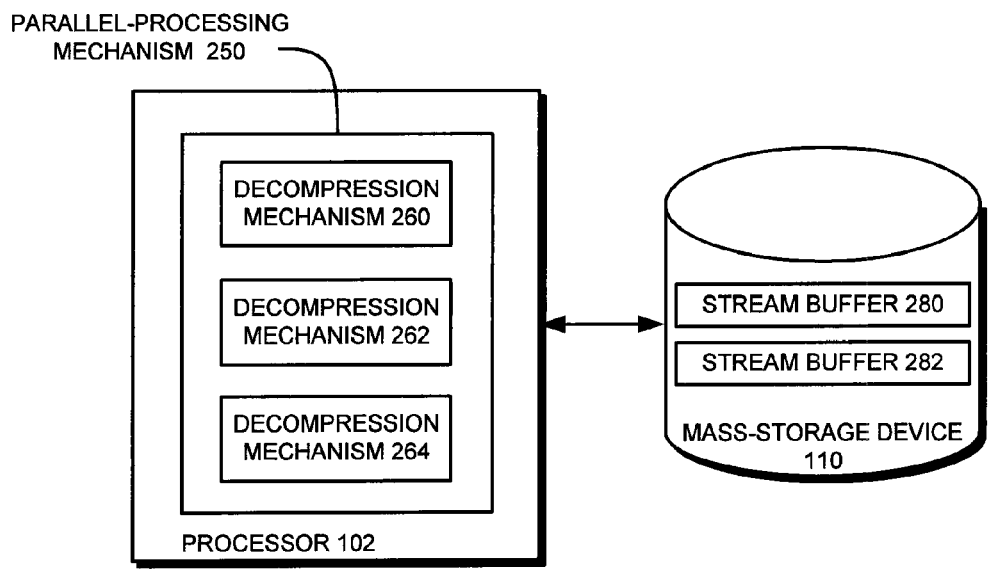
FIG. 2B presents a block diagram illustrating a processor configured to decompress data in accordance with embodiments of the present invention.

FIG. 2B presents a block diagram illustrating a processor 102 configured to decompress data in accordance with an embodiment of the present invention. Processor 102 includes a parallel-processing mechanism 250, which includes decompression mechanisms 260-264. Mass-storage device 110 includes stream buffers 280-282, where an input and an output stream are respectively stored.

During operation, decompression mechanisms 260-264 each retrieve a fixed-length packet from a corresponding channel in the input stream. Then, decompression mechanisms 260-264 retrieve and decompress a set of variable-length words from the fixed-length packet. Next, each decompression mechanism 260-264 assembles the decompressed variable-length words into every N-th position of an output stream beginning at an offset I corresponding to the channel. Note that although three decompression mechanisms 260-264 are shown, parallel-processing mechanism 250 may include any number N of decompression mechanisms.

Stream buffers 230-232 and 280-282 are illustratively stored on mass-storage device 110. In some embodiments of the present invention stream buffers 230-232 and 280-282 are stored in other types of volatile and/or non-volatile memory, whether fixed or removable, such as a cache, RAM, flash, CD-ROM, or DVD disks. In other embodiments stream buffers 230-232 and 280-282 are streamed across a network, such as a data stream received from or transmitted to the Internet, a LAN, or a wireless network (e.g., a cellular network, a home wireless network, etc.).

Although for the purposes of illustration we present processor 102 as including the mechanisms shown in FIGS. 2A and 2B, in some embodiments of the present invention processor 102 is a microprocessor or another such device that includes general-purpose circuits that can be configured to perform data compression and/or decompression. For example, processor 102 can be a microprocessor that executes instructions that configure general-purpose circuits in one or more pipelines in the processor to perform the operations performed by compression mechanism 200 and parallel-processing mechanism 250, while the stream buffer is stored in and retrieved from an L1 cache 104 and/or memory 108.

Furthermore, embodiments of the invention may be implemented using multiple threads or processes executing in parallel on multiple processors in a multiprocessor system, or multiple cores in a multi-core system, or any combination thereof. Some embodiments may be implemented as a single thread executing on a single processor to benefit from improved code scheduling.

For illustrative purposes, the term "retrieve" is used in this description to describe an operation during which a complete variable-length word becomes available for decompression in a decompression mechanism (e.g., decompression mechanism 260). However, when variable-length words are stored in sequence without padding, boundaries between variable-length words may not be known until the variable-length words are decoded. In other words, the beginning of a variable-length word can be determined only after the preceding variable-length word is decompressed. Thus, in embodiments of the present invention, the final bits in a given fixed-length packet may include a first portion of the bits from a variable length word, while the remaining portion of the bits of the variable length word are stored in the next packet in the channel (i.e., variable-length words may "span" packets).

In these embodiments, during operation, decompression mechanism 260 can retrieve a fixed-length packet which contains a portion of a variable-length word (along with zero or more complete variable length words). When decompression mechanism 260 extracts the variable-length words from the packet, any bits remaining from a variable-length word that spans packets are preserved and are combined with bits from the next packet to form the next complete variable-length word. Therefore, after "retrieving a variable-length word" a complete variable-length word is available for decompression at a decompression mechanism.

Compression Using Lossless Compression Mechanism

FIGS. 3A-3D present block diagrams illustrating a process for compressing data in accordance with embodiments of the present invention. Specifically, FIGS. 3A-3D present a sequence of operations performed by compression mechanism 200 when compressing data words received from input stream 300.

Input stream 300 is stream of fixed-length data words which is illustratively stored in stream buffer 230. Input stream 300 includes fixed length data words 310-315, but may include any number of data words. In some embodiments, the data words are produced by compressing data using a lossy compression technique. In contrast, output stream 360, which is illustratively stored in stream buffer 232, contains packets assembled by compression mechanism 200.

During operation, variable-length encoder 210 receives a fixed-length data word from input stream 300 and compresses the fixed-length data word to produce a variable-length (VL) data word. Variable-length words are then stored in round-robin fashion in packets 301-303, corresponding to channels 1-3, as described below. In some embodiments, packets 301-303 are fixed-length packets.

Packets 301-303 are packets for channels 1-3 respectively. Note that for illustrative purposes, packets 301-303 contain some existing variable-length words. Packets 301-303 may be stored in volatile memory, such as memory 108 or L1 cache 104, or non-volatile memory, such as mass-storage device 110. Additionally, packets 301-303 may be stored in a variety of hardware and/or software data structures, such as a first-in-first-out (FIFO) buffer, ring buffer, dynamically or statically allocated arrays, or linked-lists.

Figure 3A:
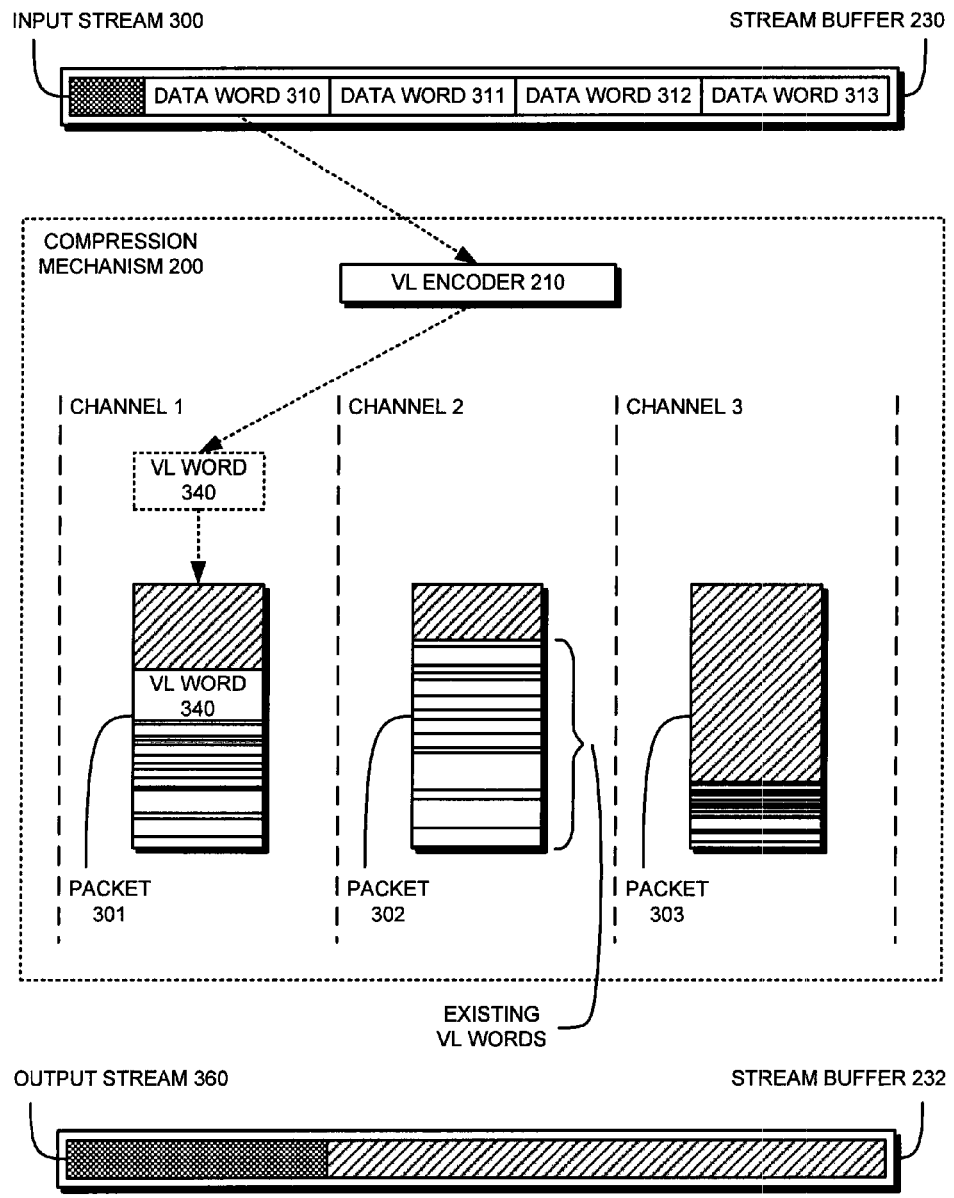
FIGS. 3A-3D present block diagrams illustrating a process for compressing data in accordance with embodiments of the present invention.

For illustrative purposes, packets fill from bottom to top. In FIG. 3A and throughout the figures, a cross-hatch pattern is used to illustrate empty (unused) portions of a packet or stream, while a darker checkerboard pattern is used to illustrate portions of a stream that contain data.

Referring to FIG. 3A, during operation, VL encoder 210 retrieves a first fixed-length data word 310 from input stream 300. VL encoder 210 then compresses data word 310 to produce variable-length word ("VL word") 340. Next, VL encoder 210 stores VL word 340 into packet 301.

Figure 3B:
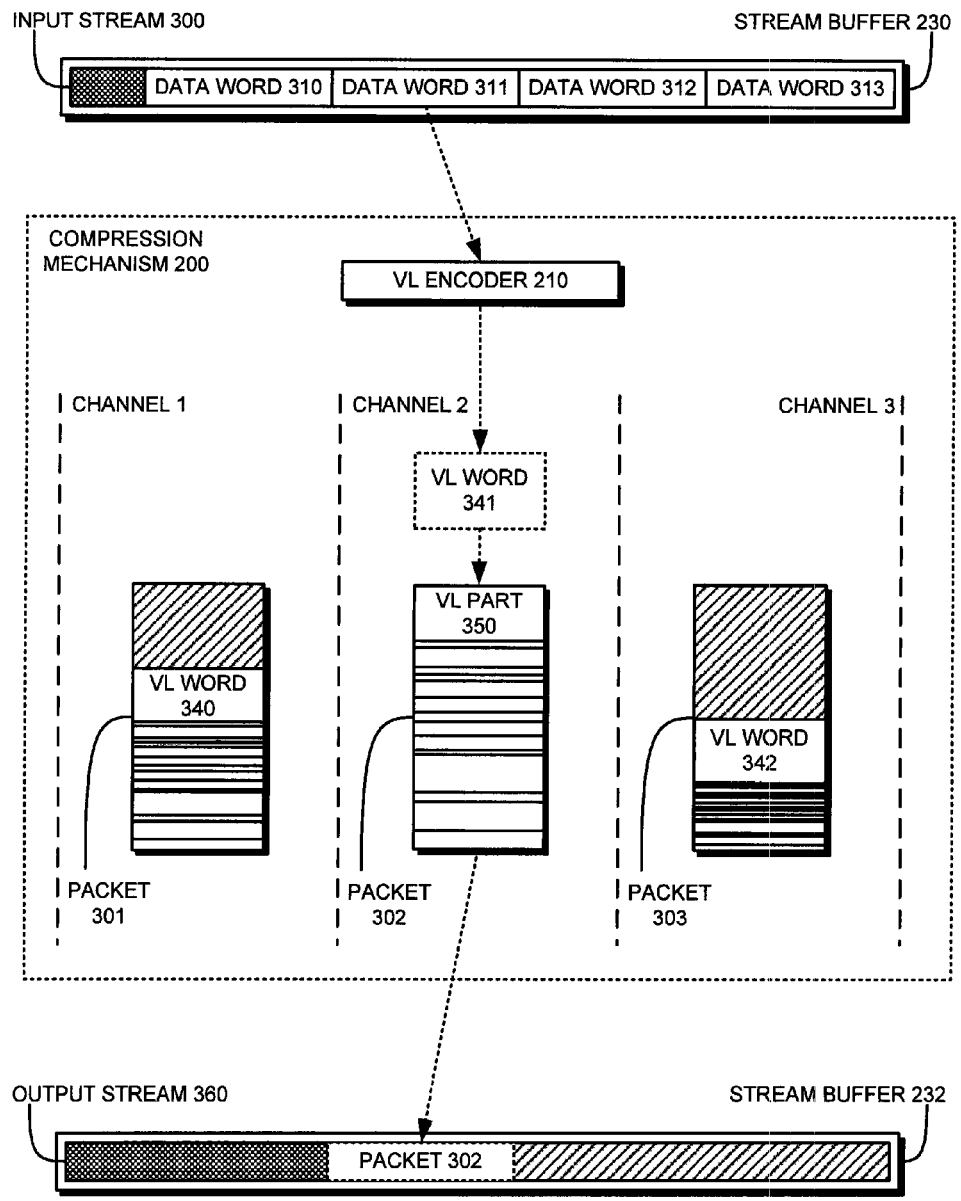

FIG. 3B shows how the next data word from input stream 300 is compressed. VL encoder 210 receives the second data word 311 and compresses it to produce VL word 341. Before storing VL word 341 into packet 302, VL encoder 210 determines there is insufficient free space in packet 302 to store VL word 341. Then, VL encoder 210 splits VL word 341 into two parts, VL part 350, which is as long as the amount of free space in packet 302, and VL part 351 (not shown). Next, VL encoder 210 stores VL part 350 into packet 302. Next, because packet 302 becomes full, VL encoder 210 assembles the packet into output stream 360. In some embodiments, VL encoder 210 appends packet 302 to previously assembled packets in output stream 360. (Note that, for illustrative purposes, output stream 360 already contains at least one packet from each channel. The placement of the first packet for each channel in output stream 360 is described later with reference to FIG. 4).

Figure 3C:
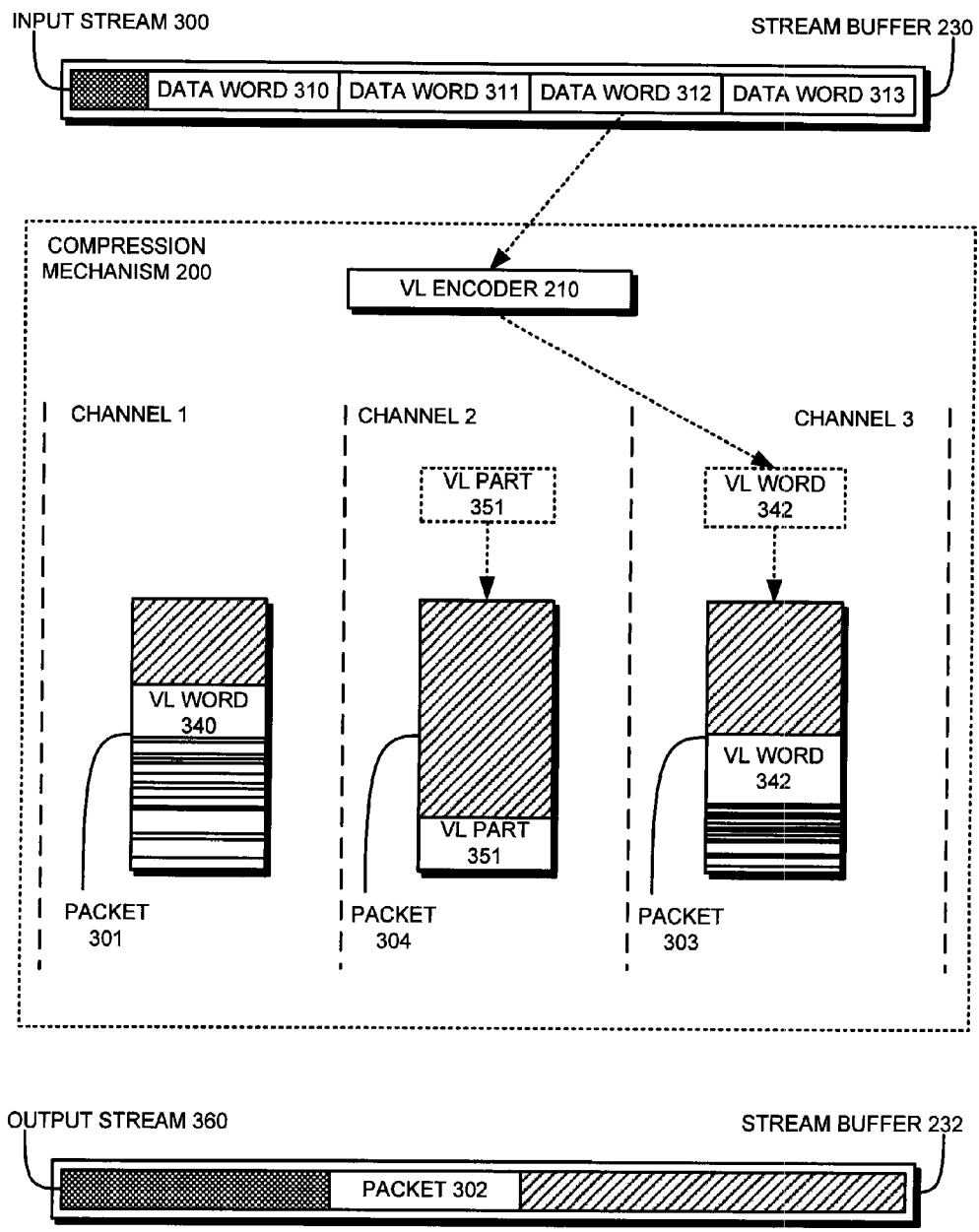

Referring now to FIG. 3C, when packet 302 becomes full, a new packet, packet 304, becomes the packet for the second channel. Before storing VL words into packet 304, VL encoder 210 first stores VL part 351 into packet 304. Next, VL encoder 210 next receives the third data word 312 from input stream 300. Then, VL encoder 210 compresses data word 312 to produce VL word 342. Next, VL encoder 210 stores VL word 342 into packet 303.

Figure 3D:
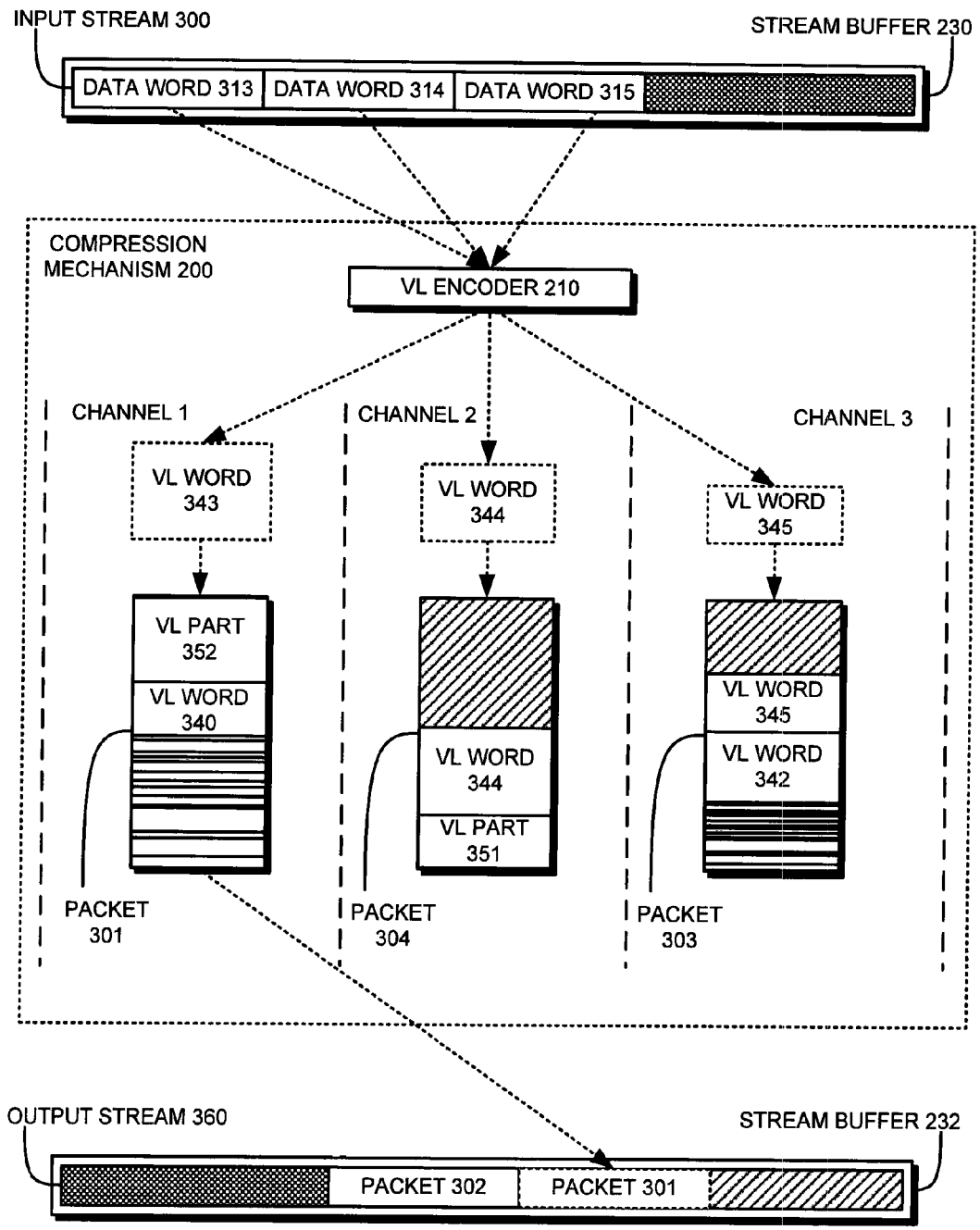

Referring now to FIG. 3D, compression and storage of data words 313-315 from input stream 300 is shown. VL encoder 210 receives data word 313 and compresses it to produce VL word 343. Before storing VL word 343 into packet 301, VL encoder 210 determines there is insufficient free space in packet 301 to store VL word 343. Thus, as described earlier with reference to FIG. 3B, VL encoder 210 stores into packet 301 VL part 352, which is the portion of VL word 343 that is as long as the amount of free space in packet 301. Next, when packet 301 becomes full, VL encoder 210 assembles packet 301 into output stream 360 by appending packet 301 to packet 302.

Continuing with FIG. 3D, VL encoder 210 receives data word 314 and compresses it to produce VL word 344. Note that packet 304 contains VL part 351, which was stored by VL encoder 210 as described earlier with reference to FIG. 3B. Next, VL encoder 210 stores VL word 344 into packet 304. Then, VL encoder 210 receives data word 315, compresses it to produce VL word 345, and stores VL word 345 into packet 303. As can be seen in FIGS. 3A-3D, VL encoder 210 stores variable-length words to packets in "round-robin" fashion.

The system illustrated in FIGS. 3A-3D includes three channels and a single VL encoder which compresses data words sequentially. Other embodiments may use two or more VL encoders to speed up processing. In some embodiments, the number of encoders is equal to the number of channels and data can be fetched from input stream 300 in sets of N data words at a time. Variable-length encoders can then each compress a data word from the set in parallel.

Figure 3E:
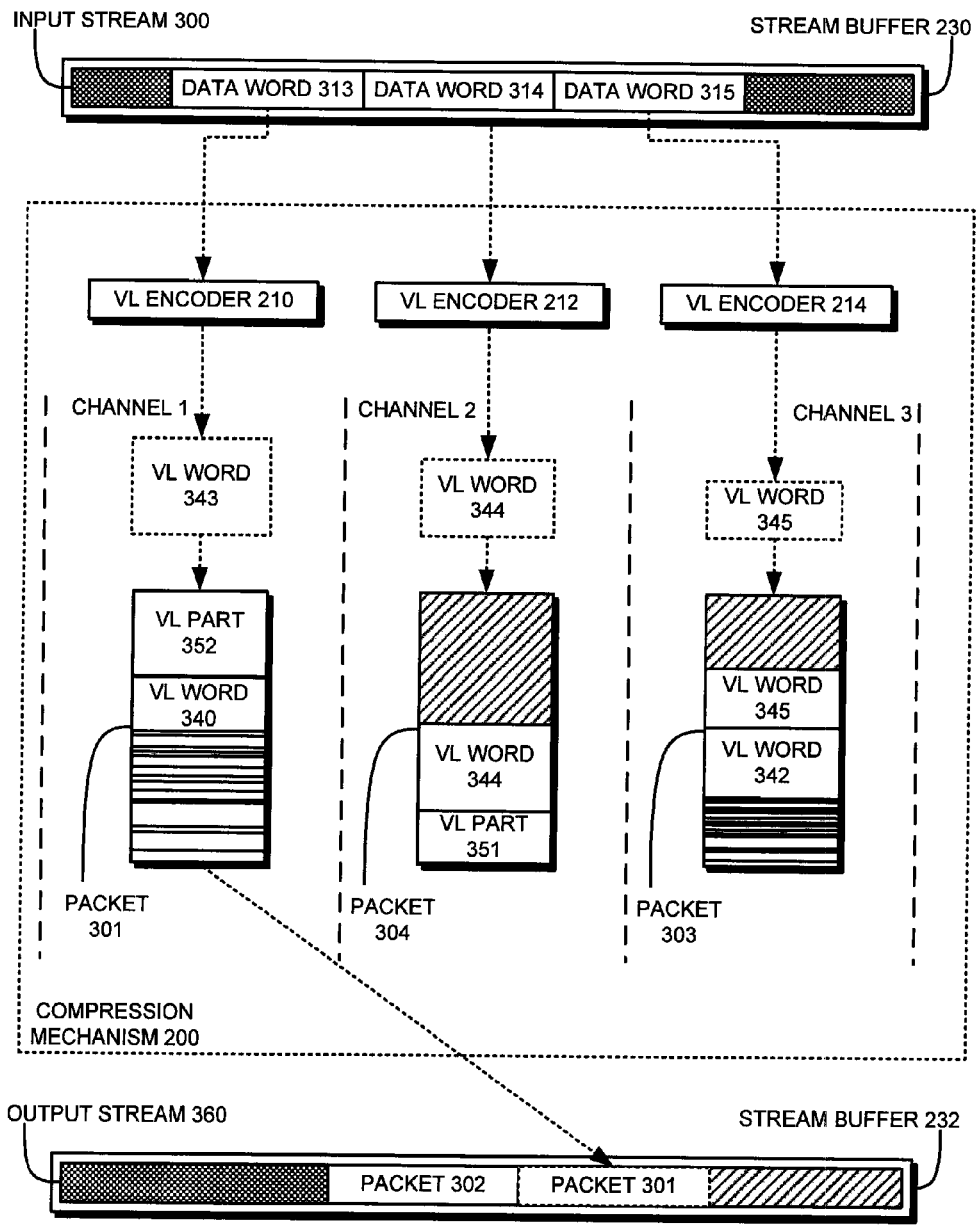
FIG. 3E presents a block diagram of a system that includes three VL encoders for compressing data in parallel in accordance with embodiments of the present invention.

For example, FIG. 3E presents a block diagram of a system that includes three VL encoders for compressing data in parallel in accordance with embodiments of the present invention. In this embodiment data words are fetched from input stream 300 in sets of three, because three data words can be compressed in parallel. (For illustrative purposes the same data words are compressed in FIG. 3E as in FIG. 3D).

During operation, VL encoders 210-214 receive a first set of data words 313-315. Next, VL encoders 210-214 compress one word each into variable-length words 343-345. VL encoders 212-214 store VL words 344-345 into packets 304 and 303, which are the packets for channels 2 and 3, respectively. As described earlier with reference to FIG. 3D, VL encoder 210 stores VL part 352 into packet 301, which is the packet for channel 1. Packet 301 becomes full, so VL encoder 210 appends packet 301 to output stream 360, as described earlier with reference to FIG. 3D.

Although three channels are shown in FIGS. 3A-3E, it would be apparent to one skilled in the art to generalize the illustrated embodiments to any number N channels. In embodiments of compression mechanism 200 that include N channels, compression mechanism 200 receives a set of N data words from input stream 300, compresses the data words into a set of N variable-length words, and stores an I-th variable-length word from the set of N data words into a fixed-length packet for the I-th channel, where $0 < I \leq N$. Then, compression mechanism 200 assembles each fixed-length packet into output stream 360 when the packet becomes full.

Embodiments of the present invention compress data in a manner that removes serialized dependencies when decompressing the data. In other words, by distributing variable-length words across several packets, embodiments of the present invention facilitate parallelizing the decompression process, because variable-length words in the packets can be decompressed in parallel. Although decoding a variable-length word still depends on decoding the variable-length word that preceded it within the packet, there are no serialized dependencies between a set of N words across N packets, which facilitates a set of N words to be decompressed in parallel. The process of decompressing data in this manner is described in more detail in the decompression section.

Assembling N First Packets

In some embodiments of the present invention, compression mechanism 200 stores the first packet that becomes full from each of the N channels at predetermined locations in the output stream. Specifically, in some embodiments of the present invention compression mechanism 200 assembles the first packet that becomes full for an I-th channel so that the packet is the I-th packet in the output stream.

Figure 4:
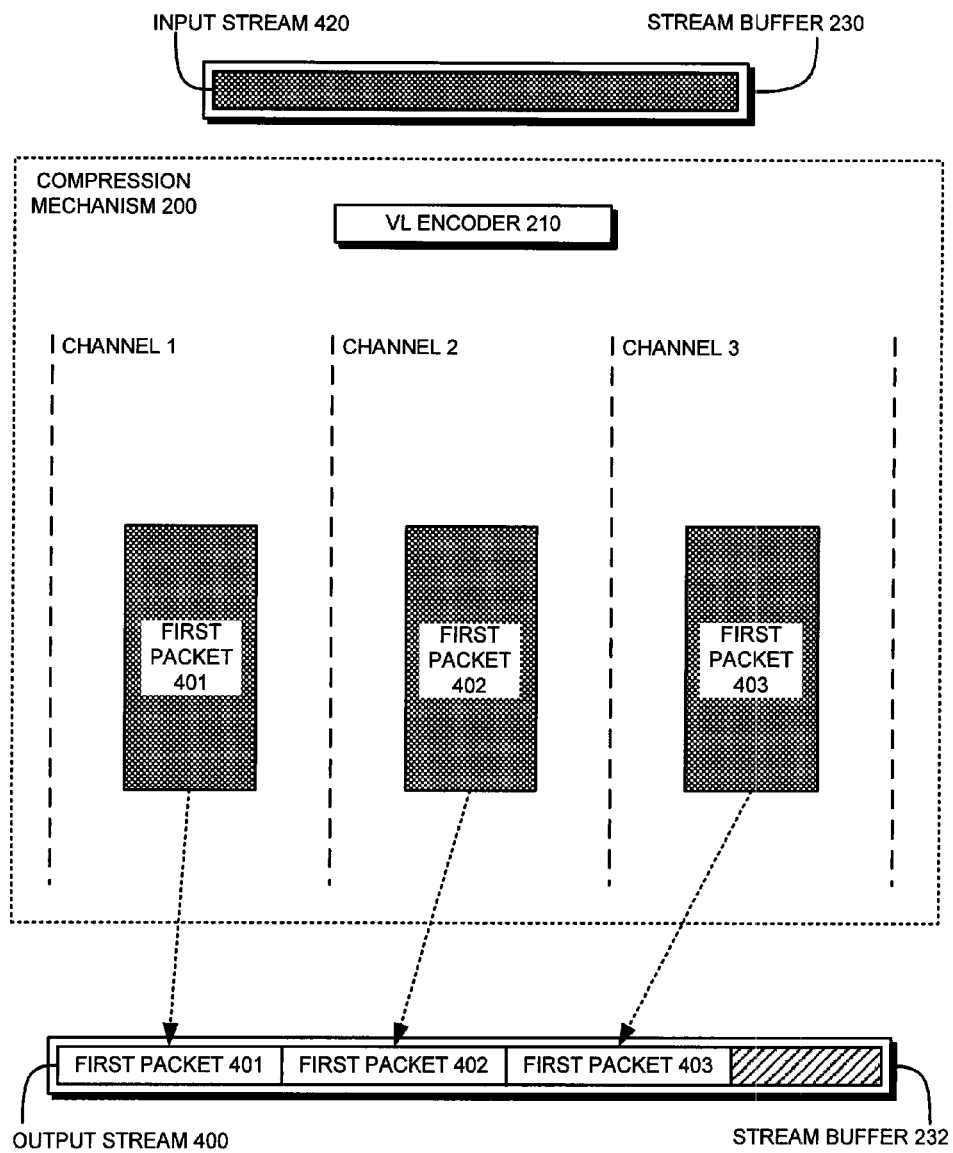
FIG. 4 presents a block diagram illustrating a process for placing the first packet from each channel at predetermined locations in an output stream.

FIG. 4 presents a block diagram illustrating a process for assembling the first packet that becomes full from each channel ("first packet") at predetermined locations in an output stream. Specifically, FIG. 4 presents a sequence of operations performed by compression mechanism 200 when assembling first packets 401-403 for channels 1-3 into output stream 400, which is illustratively stored in stream buffer 232.

First packets 401-403 contain VL words produced by VL encoder 210 by compressing data words from input stream 420, in accordance with embodiments of the present invention. First packets 401-403 are the first packets to become full for channels 1-3, respectively. Illustratively, first packets 401-403 are shown full at the same time, although packets 401-403 may become full at different times. VL encoder 210 places first packet 401, which is the first packet to become full for the first channel, at the first location in output stream 400. Then, VL encoder 210 stores first packets 402-403, which are the first packets to become full for the second and third channel, at the second and third location in output stream 400, respectively. In other words, the first packet for each of the N channels is stored at predetermined locations in output stream 400.

Decompression with Parallel-Processing Mechanism

Figure 5A:
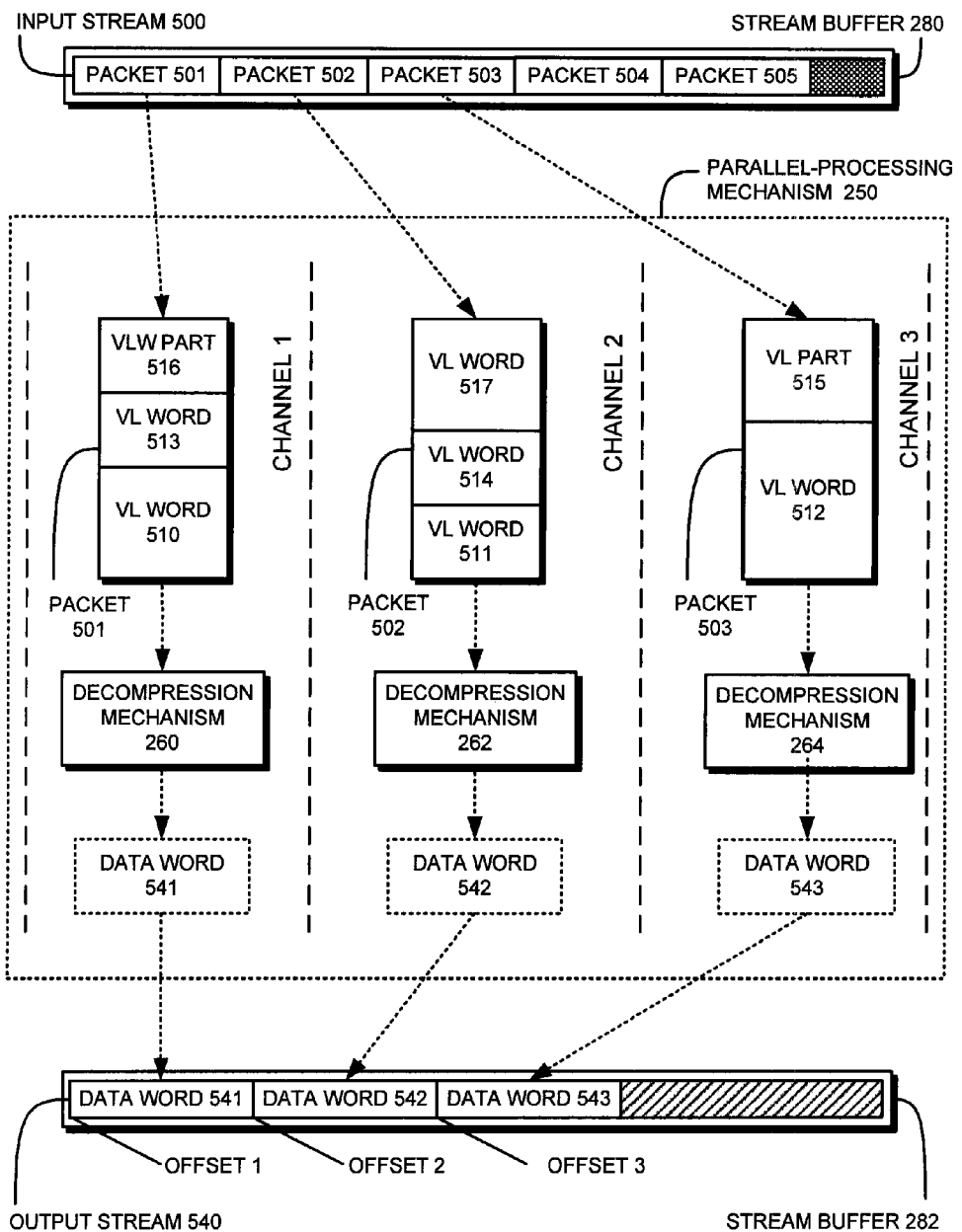
FIGS. 5A-5B present a block diagram illustrating a process for decompressing data in accordance with embodiments of the present invention.
Figure 5B:
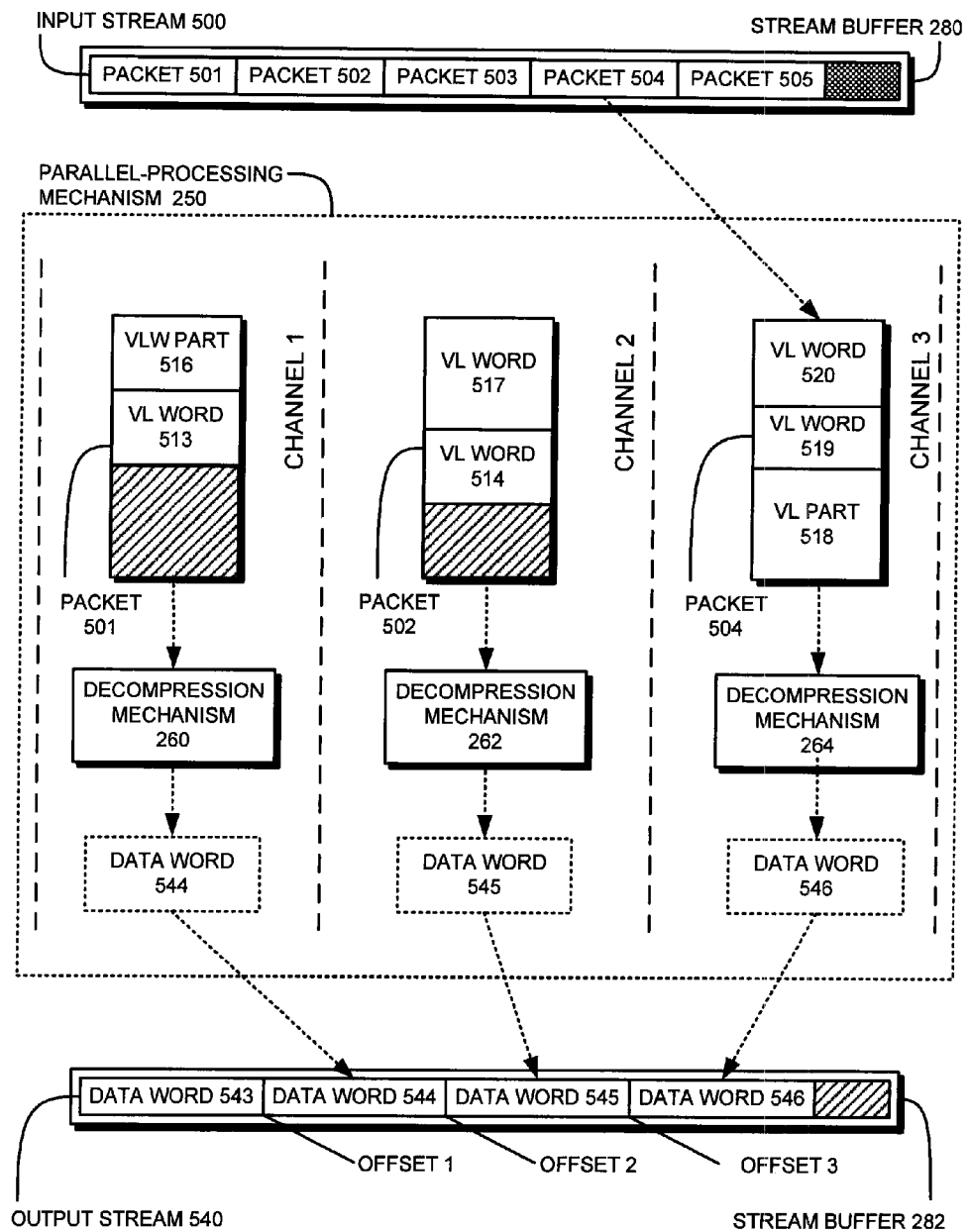

FIGS. 5A-5B present a block diagram illustrating a process for decompressing data in accordance with embodiments of the present invention. Specifically, FIGS. 5A-5B present a sequence of operations performed by parallel-processing mechanism 250 when decompressing packets from input stream 500.

Input stream 500, which is illustratively stored in stream buffer 280, comprises three channels (N=3) and contains packets assembled by a compression mechanism 200 in accordance with embodiments of the present invention. Note that packets 501-503 illustratively are the first packets for channels 1-3, as described earlier with reference to FIG. 4. Output stream 540 is illustratively stored in stream buffer 282.

During operation, decompression mechanisms 260-264 retrieve a fixed-length packet 501-503 from a corresponding channel 1-3 in input stream 500. Then, decompression mechanisms 260-264 retrieve a set of VL words 510-512 from packets 501-503, respectively, and decompress the set of VL words into data words 541-543. Note that decompression mechanisms 260-264 are designed to operate in parallel to decompress a variable-length word independently from each other. Then, a decompression mechanism for the I-th channel assembles the decompressed variable-length word into a first position of output stream 540 beginning at an offset I. Specifically, because output stream 540 is empty and packets 501-503 are the first packets for channels 1-3, decompression mechanisms 260-264 store data words 541-543 into the first position of output stream 540, beginning at offsets 1-3, respectively. (Note that the offset is measured in packet length units).

Referring to FIG. 5B, in the next iteration, decompression mechanisms 260-262 retrieve VL words 513-514, decompress them to data words 544-545 respectively, and store data words 544-545 into a second position of output stream 540 at offset 1-2, respectively. Note that in FIG. 5A packet 503, which was the packet for channel 3, contained one complete VL word 512, which was decompressed as described earlier with reference to FIG. 5A. The remainder of packet 503 contained VL part 515 (shown in FIG. 5A), which is part of a VL word that spans two packets. In order to decompress the next full VL word, decompression mechanism 264 first retrieves from input stream 500 fixed-length packet 504, which contains VL part 518. Then, decompression mechanism 264 combines VL part 515 with VL part 518 and decompresses the combined VL word into data word 546. Next, decompression mechanism 264 stores data word 546 into the second position of output stream 540 at offset 3.

Note that decompression mechanisms 260-264 are configured to retrieve the next packet from input stream 500 when the packet for the channel corresponding to the decompression mechanism becomes empty. In some embodiments of the present invention, when packets in more than one decompression mechanism 260-264 become empty at the same time, decompression mechanisms 260-264 are configured to retrieve the next packet from input stream 500 in channel order.

For illustrative purposes input stream 500 comprises three channels (N=3), and parallel-processing mechanism 250 comprises a corresponding channel for each channel in input stream 500. In other embodiments, input stream 500 may comprise any number of channels N. For an input stream that comprises N channels, embodiments of the invention achieve a decompression speed-up that is proportional to the number of channels. For example, a decompression task parallelized with N channels can decompress data in approximately 1/N of the time it takes to decompress the same data serially.

Process for Compressing Data

Figure 6:
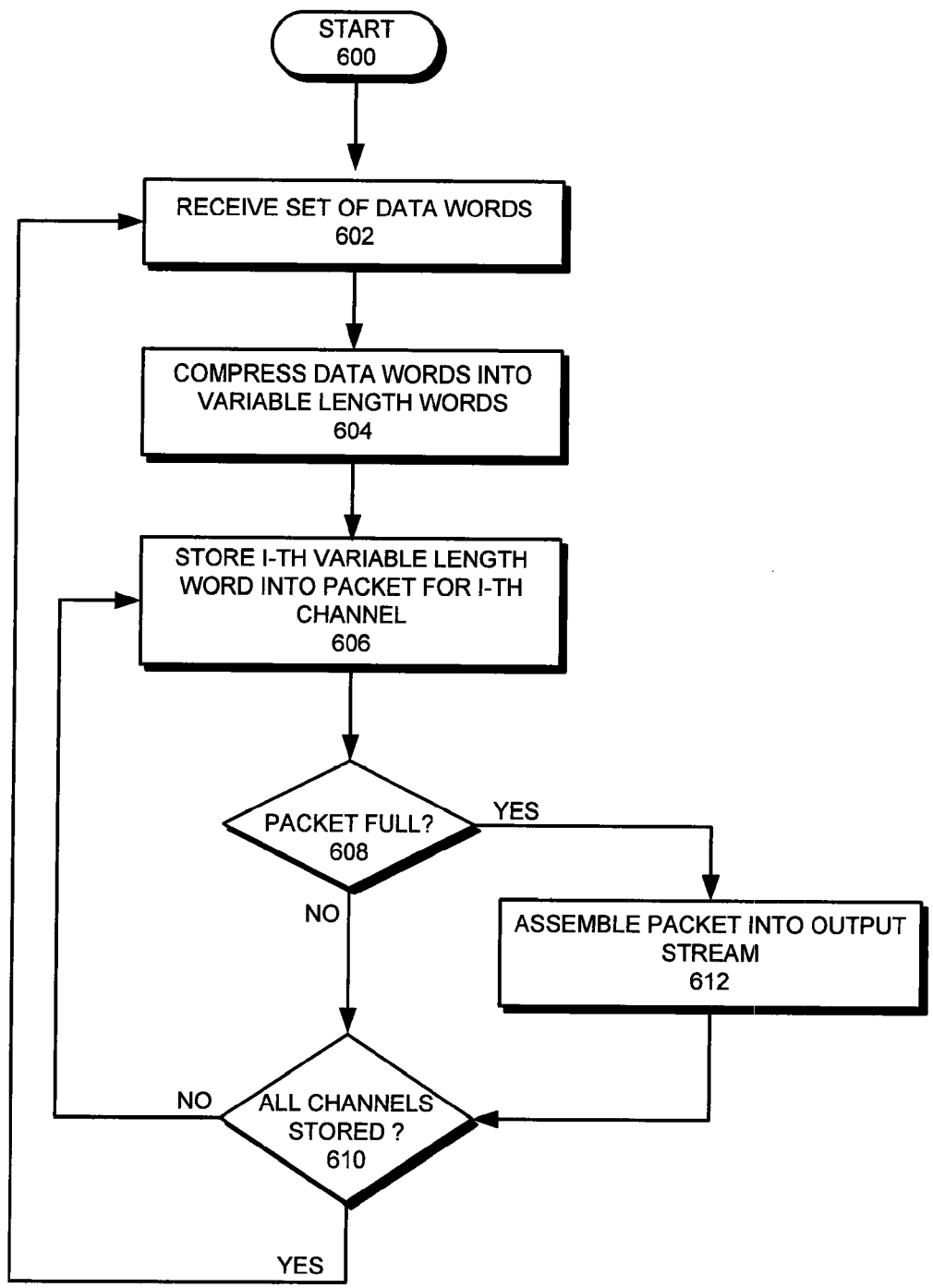
FIG. 6 presents a flowchart illustrating a process for compressing and storing data in accordance with embodiments of the present invention.

FIG. 6 presents a flowchart illustrating a process for compressing and storing data in accordance with embodiments of the present invention. The embodiment illustrated in this figure uses N channels and a single variable-length encoder, similar to the system of FIGS. 3A-3C. For illustrative purposes, FIG. 6 includes a variable I that is used to iterate through all N channels.

The process for compressing data starts when compression mechanism 200 receives a set of data words from an input bit-stream (step 602). For N channels, compression mechanism 200 typically receives a set of N data words from the input bit-stream. Next, compression mechanism 200 compresses the data words into a set of variable-length words (step 604). Then, compression mechanism 200 stores an I-th variable-length word in the set of N VL words into a packet for the I-th channel (step 606).

Next, compression mechanism 200 determines if the packet for the I-th channel is full (step 608). If the packet is not full (step 608, No), compression mechanism 200 continues to store the I-th variable-length word into a packet for the I-th channel (step 610, No) until variable-length words for all N channels have been stored to packets (step 610, Yes). Then, compression mechanism 200 receives a next set of data words (step 602).

Returning to step 608, if the packet is full (step 608, Yes), compression mechanism 200 assembles the packet into an output stream (step 612). Then, compression mechanism 200 continues to store an I-th variable length word into a packet for an I-th channel until all N variable-length words for the N channels have been stored.

Although the exemplary embodiment is illustrated as a single process executing serially, one skilled in the art will understand that other embodiments may execute the compression flow in parallel, e.g., a separate processor, process or thread may be allocated to each channel and/or each variable-length encoder.

Process for Decompressing Data

Figure 7:
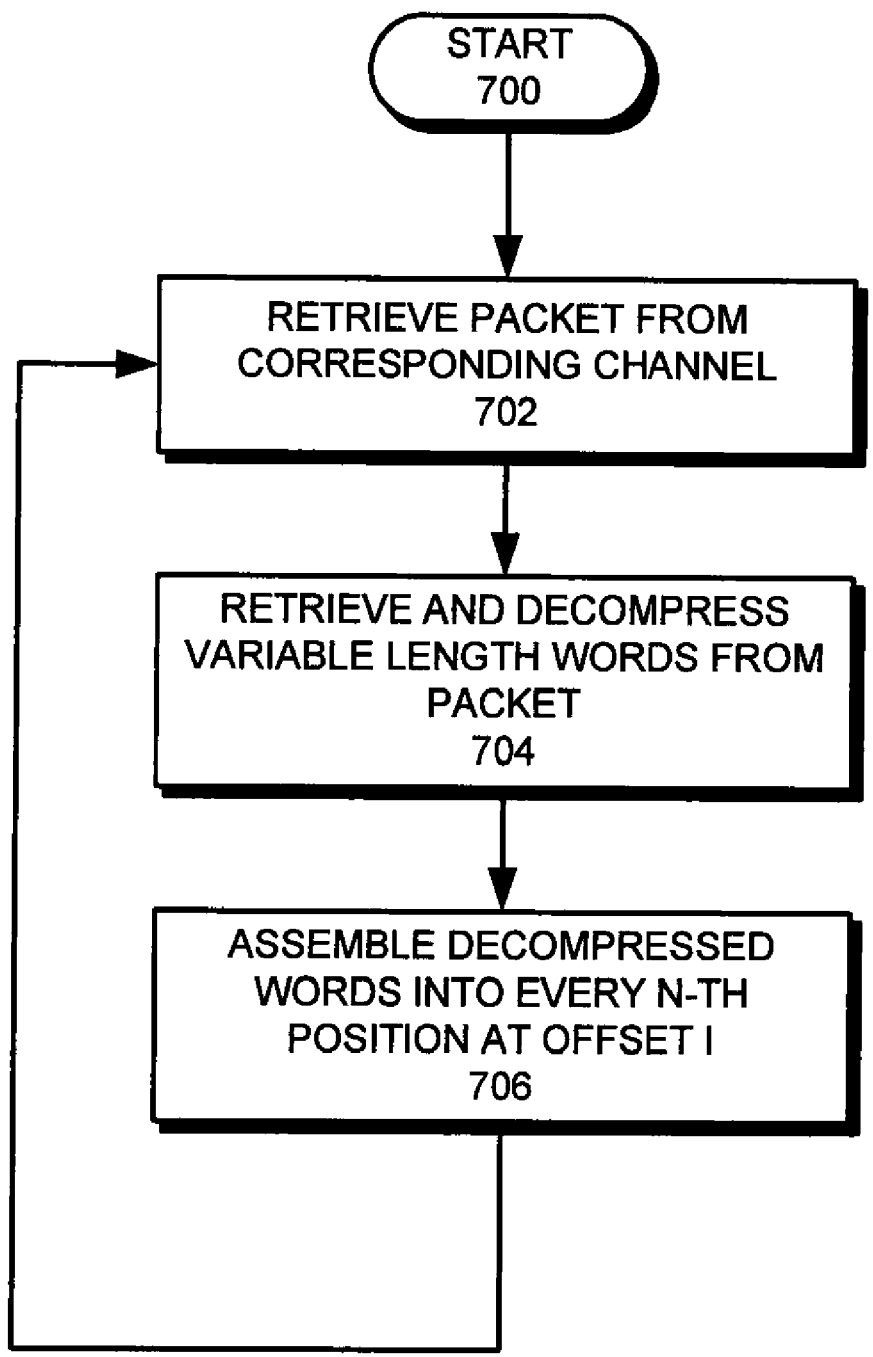
FIG. 7 presents a block diagram illustrating a process for decompressing data in accordance with embodiments of the present invention.

FIG. 7 presents a flowchart illustrating a process for decompressing data in accordance with embodiments of the present invention. The embodiment of FIG. 7 includes N channels.

The process for decompressing data starts when each decompression mechanism retrieves a fixed-length packet from a corresponding channel in an input stream that includes N channels (step 702). Then, each decompression mechanism retrieves and decompresses a set of variable-length words from the fixed-length packet (step 704). Next, each decompression mechanism assembles the decompressed variable-length words into every N-th position of an output stream beginning at an offset I corresponding to the channel (step 706).

Note that each decompression mechanism may finish decompressing a variable-length word separately and at different times from other decompression mechanisms. However, the process of assembling the decompressed variable-length words serializes the variable-length words so they are stored in the output bit-stream in the same order as the order they were compressed in.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for performing data compression, comprising:
    a compression mechanism comprising N channels, the mechanism configured to:
        receive a set of data words from an input bit-stream;
        compress the data words into a set of variable-length words;
        store an I-th variable-length word in the set of variable-length words into a fixed-length packet for an I-th channel; and
        assemble each fixed-length packet into an output stream when the packet becomes full, wherein while assembling each fixed-length packet into the output stream, the compression mechanism is configured to assemble into the output stream fixed-length packets for two or more channels that become full at the same time in channel order,
    wherein assembling the fixed-length packets in this way facilitates decompressing the output stream without including in the output stream information that identifies a channel for a fixed-length packet.

2. The apparatus of claim 1, wherein the compression mechanism is further configured to compress the data words using entropy coding.

3. The apparatus of claim 1, wherein the compression mechanism is further configured to compress the data words using arithmetic coding.

4. The apparatus of claim 1, further configured to assemble each fixed-length packet into the output stream by appending the fixed-length packet to previously assembled packets.

5. The apparatus of claim 1, wherein the fixed-length packet is maintained in a first-in-first-out (FIFO) buffer, ring buffer, dynamically allocated array, statically allocated array, or linked-list.

6. The method of claim 1, further comprising placing a first packet that becomes full for the I-th channel in a set of first packets for the output stream, wherein the set of first packets includes a first packet for each channel, and wherein the first packet for the I-th channel is an I-th packet in the set of first packets.

7. An apparatus for performing data decompression, the apparatus comprising:
    a parallel-processing mechanism which includes N decompression mechanisms, wherein each decompression mechanism is configured to:
        retrieve a fixed-length packet from a corresponding channel in an input stream;
        retrieve and decompress a set of variable-length words from the fixed-length packet; and
        assemble the decompressed variable-length words into every N-th position of an output stream beginning at an offset I corresponding to the channel, wherein while retrieving a fixed-length packet from the input stream, the parallel-processing mechanism is configured to retrieve from the input stream fixed-length packets for two or more channels that become empty at the same time in channel order,
    wherein retrieving the fixed-length packets in this way facilitates decompressing the input stream without including in the input stream information that identifies a channel for a fixed-length packet.

8. The apparatus of claim 7, wherein the output stream contains a stream of commands that are executed during playback to reconstruct a video image.

9. The apparatus of claim 7, wherein at least one decompression mechanism is further configured to decompress each variable-length word using entropy coding.

10. The apparatus of claim 7, wherein at least one decompression mechanism is further configured to decompress each variable-length word using arithmetic coding.

11. A method for performing data compression, the method comprising:
    receiving a set of data words from an input bit-stream which comprises N channels;
    compressing the data words into a set of variable-length words;
    storing an I-th variable-length word in the set of variable-length words into a fixed-length packet for an I-th channel;
    assembling each fixed-length packet into an output stream when the packet becomes full; and
    while assembling each fixed-length packet into the output stream, assembling into the output stream fixed-length packets for two or more channels that become full at the same time in channel order, wherein assembling the fixed-length packets in this way facilitates decompressing the output stream without including in the output stream information that identifies a channel for a fixed-length packet.

12. The method of claim 11, further comprising compressing the data words using entropy coding.

13. The method of claim 11, further comprising compressing the data words using arithmetic coding.

14. The method of claim 11, further comprising assembling each fixed-length packet into the output stream by appending the fixed-length packet to previously assembled packets.

15. The method of claim 11, further comprising placing a first packet from each of the N channels at predetermined locations in the output stream.

16. A method for performing data decompression, the method comprising:
   retrieving a fixed-length packet from a corresponding channel in an input stream which comprises N channels;
   retrieving and decompressing a set of variable-length words from the fixed-length packet;
   assembling the decompressed variable-length words into every N-th position of an output stream beginning at an offset I corresponding to the channel; and
   while retrieving a fixed-length packet from the input stream, retrieving from the input stream fixed-length packets for two or more channels that become empty at the same time in channel order,
   wherein retrieving the fixed-length packets in this way facilitates decompressing the input stream without including in the input stream information that identifies a channel for a fixed-length packet.

17. The method of claim 16, wherein the output stream contains a stream of commands that are executed during playback to reconstruct a video image.

18. The method of claim 16, further comprising decompressing a variable-length word using entropy coding.

19. The method of claim 16, further comprising decompressing a variable-length word using arithmetic coding.

20. A computer-readable storage medium storing instructions that when executed by a computer cause the computer to perform a method for compressing data, the method comprising:
   receiving a set of data words from an input bit-stream which comprises N channels;
   compressing the data words into a set of variable-length words;
   storing an I-th variable-length word in the set of variable-length words into a fixed-length packet for an I-th channel;
   assembling each fixed-length packet into an output stream when the packet becomes full; and
   while assembling each fixed-length packet into the output stream, assembling into the output stream fixed-length packets for two or more channels that become full at the same time in channel order,
   wherein assembling the fixed-length packets in this way facilitates decompressing the output stream without including in the output stream information that identifies a channel for a fixed-length packet.

21. The computer-readable storage medium of claim 20, further comprising compressing the data words using entropy coding.

22. The computer-readable storage medium of claim 20, further comprising compressing the data words using arithmetic coding.

23. The computer-readable storage medium of claim 20, further comprising assembling each fixed-length packet into the output stream by appending the fixed-length packet to previously assembled packets.

24. The computer-readable storage medium of claim 20, further comprising placing a first packet from each of the N channels at predetermined locations in the output stream.

25. A computer-readable storage medium storing instructions that when executed by a computer cause the computer to perform a method for decompressing data, the method comprising:
   retrieving a fixed-length packet from a corresponding channel in an input stream which comprises N channels;
   retrieving and decompressing a set of variable-length words from the fixed-length packet;
   assembling the decompressed variable-length words into every N-th position of an output stream beginning at an offset I corresponding to the channel; and
   while retrieving a fixed-length packet from the input stream, retrieving from the input stream fixed-length packets for two or more channels that become empty at the same time in channel order,
   wherein retrieving the fixed-length packets in this way facilitates decompressing the input stream without including in the input stream information that identifies a channel for a fixed-length packet.

26. The computer-readable storage medium of claim 25, wherein the output stream contains a stream of commands that are executed during playback to reconstruct a video image.

27. The computer-readable storage medium of claim 25, further comprising decompressing a variable-length word using entropy coding.

28. The computer-readable storage medium of claim 25, further comprising decompressing a variable-length word using arithmetic coding.

* * * * *